United States Patent
Lee

(10) Patent No.: US 8,053,794 B2
(45) Date of Patent: Nov. 8, 2011

(54) NITRIDE SEMICONDUCTOR LIGHT EMITTING DEVICE AND FABRICATION METHOD THEREOF

(75) Inventor: Suk Hun Lee, Gwangjoo-si (KR)

(73) Assignee: LG Innotek Co., Ltd, Seoul (KR)

( * ) Notice: Subject to any disclaimer, the term of this patent is extended or adjusted under 35 U.S.C. 154(b) by 64 days.

(21) Appl. No.: 11/661,186

(22) PCT Filed: Aug. 19, 2005

(86) PCT No.: PCT/KR2005/002757
§ 371 (c)(1),
(2), (4) Date: Feb. 26, 2007

(87) PCT Pub. No.: WO2006/022498
PCT Pub. Date: Mar. 2, 2006

(65) Prior Publication Data
US 2007/0252135 A1 Nov. 1, 2007

(30) Foreign Application Priority Data

Aug. 26, 2004 (KR) .................. 10-2004-0067495
Aug. 26, 2004 (KR) .................. 10-2004-0067497

(51) Int. Cl.
*H01L 33/00* (2010.01)
(52) U.S. Cl. ............... 257/96; 257/85; 257/101
(58) Field of Classification Search .......... 257/85, 257/96, 101, 185, 191, E21.365–E21.368
See application file for complete search history.

(56) References Cited

U.S. PATENT DOCUMENTS

| 5,585,648 | A |   | 12/1996 | Tischler |
| 5,661,074 | A | * | 8/1997  | Tischler ..................... 438/32 |
| 5,684,309 | A | * | 11/1997 | McIntosh et al. ........... 257/191 |
| 5,812,577 | A | * | 9/1998  | Dawson et al. ......... 372/46.015 |
| 6,051,847 | A |   | 4/2000  | Oku et al. |

(Continued)

FOREIGN PATENT DOCUMENTS

CN 1490888 A 4/2004

(Continued)

OTHER PUBLICATIONS

Jeon et al., "Lateral Current Spreading in GaN-based light-emitting diodes utilizing tunnel contact junctions," Applied Phsyics Letters, vol. 78, No. 21, pp. 3265-3267, American Institute of Physics (May 21, 2001).

*Primary Examiner* — Bradley K Smith
(74) *Attorney, Agent, or Firm* — Birch, Stewart, Kolasch & Birch, LLP

(57) ABSTRACT

A nitride semiconductor light-emitting device according to the present invention comprises a first nitride semiconductor layer; an active layer formed on the first nitride semiconductor layer; a second nitride semiconductor layer formed on the active layer; and a third nitride semiconductor layer having AlIn, which is formed on the second nitride semiconductor layer. And a nitride semiconductor light-emitting device comprises a first nitride semiconductor layer; an n-AlInN cladding layer formed on the first nitride semiconductor layer; an n-InGaN layer formed on the n-AlInN cladding layer; an active layer formed on the n-InGaN layer; a p-InGaN layer formed on the active layer; a p-AlInN cladding layer formed on the p-InGaN layer; and a second nitride semiconductor layer formed on the p-AlInN cladding layer.

18 Claims, 7 Drawing Sheets

U.S. PATENT DOCUMENTS

| | | | |
|---|---|---|---|
| 6,410,939 B1 | 6/2002 | Koide et al. | |
| 6,765,234 B2 * | 7/2004 | Koide | 257/88 |
| 6,778,582 B1 * | 8/2004 | Mooradian | 372/97 |
| 6,936,860 B2 | 8/2005 | Sung et al. | |
| 7,176,480 B2 | 2/2007 | Ohtsuka et al. | |
| 2002/0079498 A1 | 6/2002 | Koide | |
| 2003/0134446 A1 * | 7/2003 | Koike et al. | 438/41 |
| 2003/0164506 A1 | 9/2003 | Edmond et al. | |
| 2004/0159851 A1 | 8/2004 | Edmond et al. | |
| 2005/0067627 A1 | 3/2005 | Shen et al. | |
| 2005/0250233 A1 | 11/2005 | Lee | |

FOREIGN PATENT DOCUMENTS

| | | |
|---|---|---|
| EP | 1 265 273 A1 | 12/2002 |
| JP | 10-51070 A | 2/1998 |
| JP | 10-51074 A | 2/1998 |
| JP | 2000-286451 A | 10/2000 |
| JP | 2002-33513 A | 1/2002 |
| JP | 2003-060236 A | 2/2003 |
| WO | WO-03/026029 A1 | 3/2003 |
| WO | WO-2004017432 * | 2/2004 |
| WO | 2004/042832 A1 | 5/2004 |
| WO | WO-2004/051707 A2 | 6/2004 |

\* cited by examiner

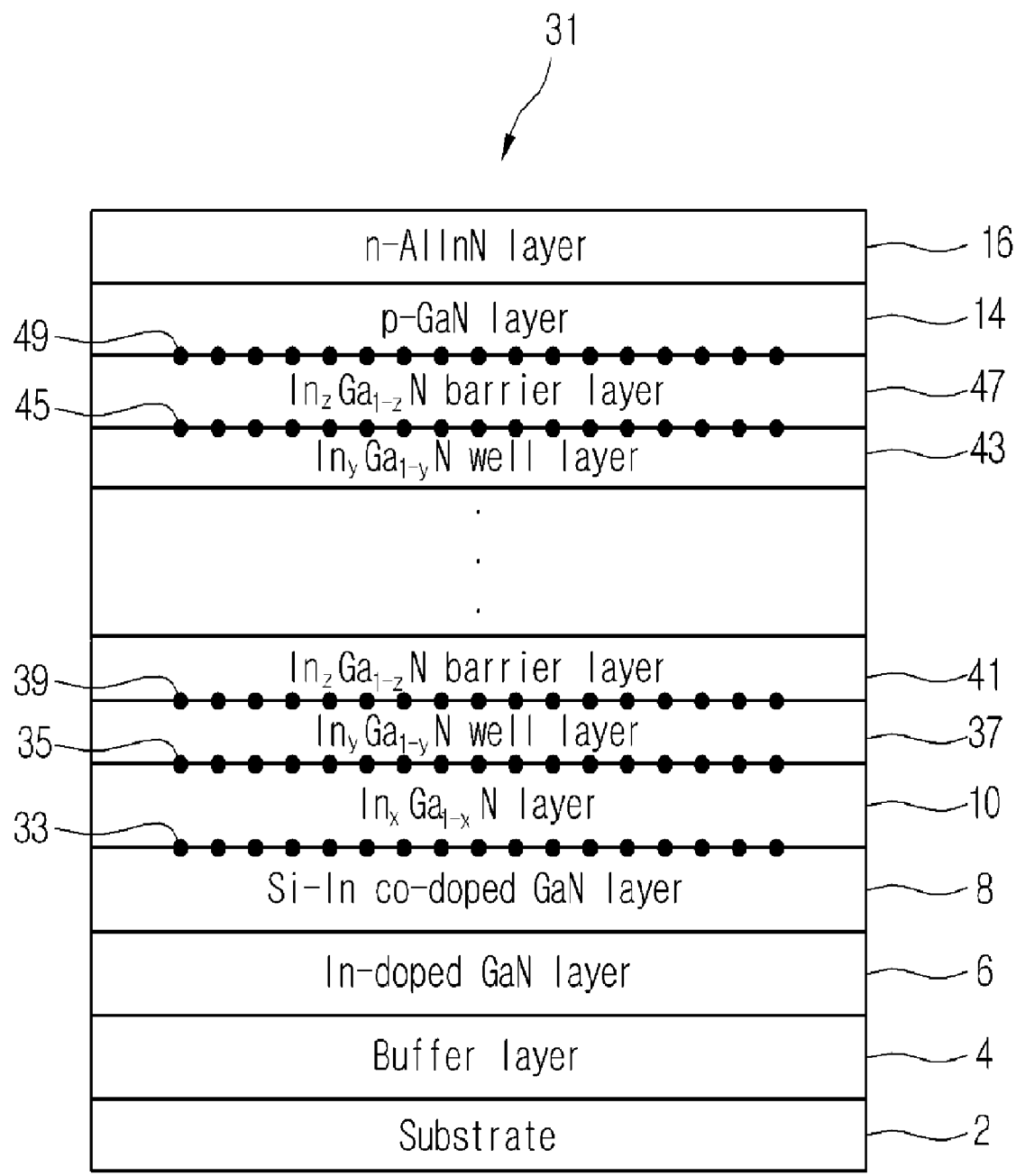
[Fig. 3]

[Fig. 4]
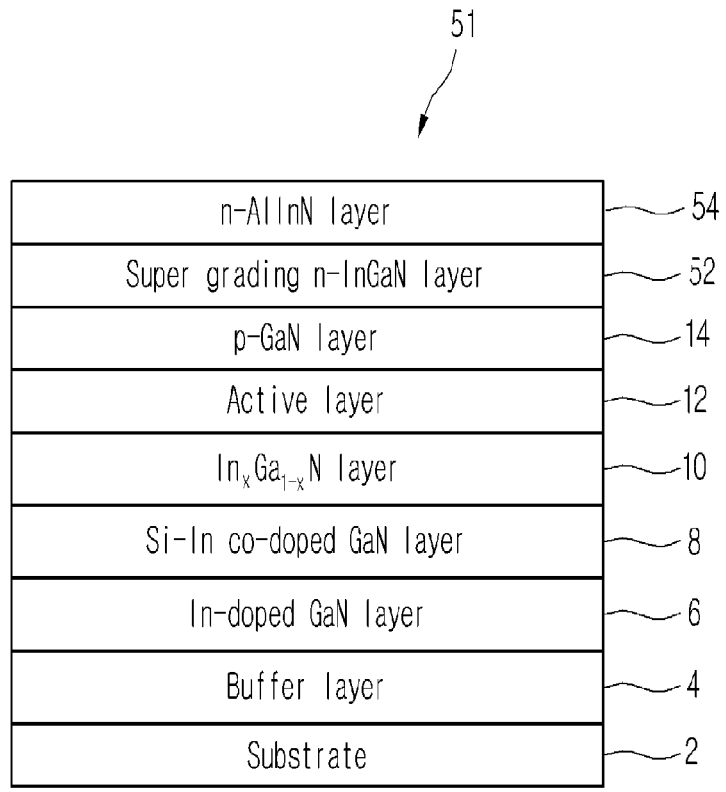
[Fig. 5]
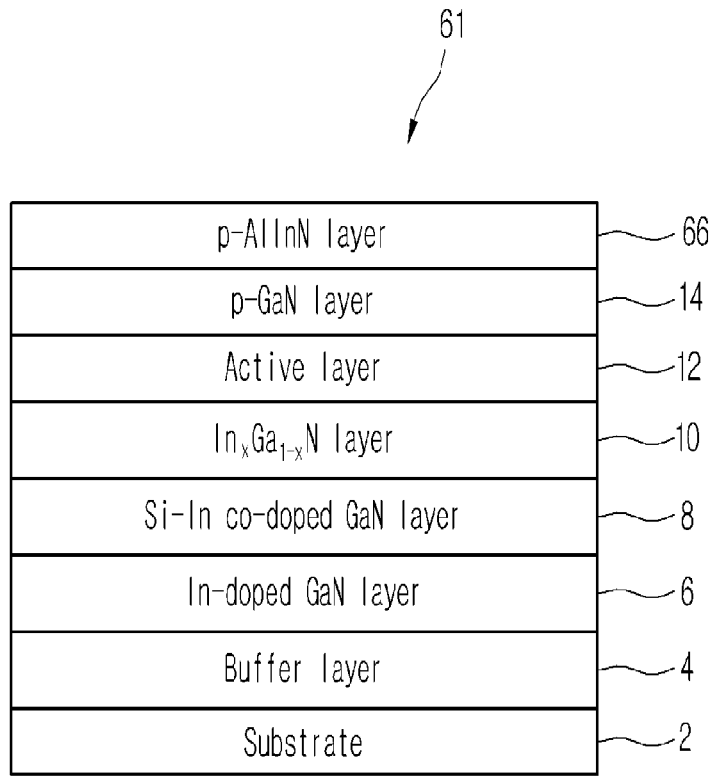

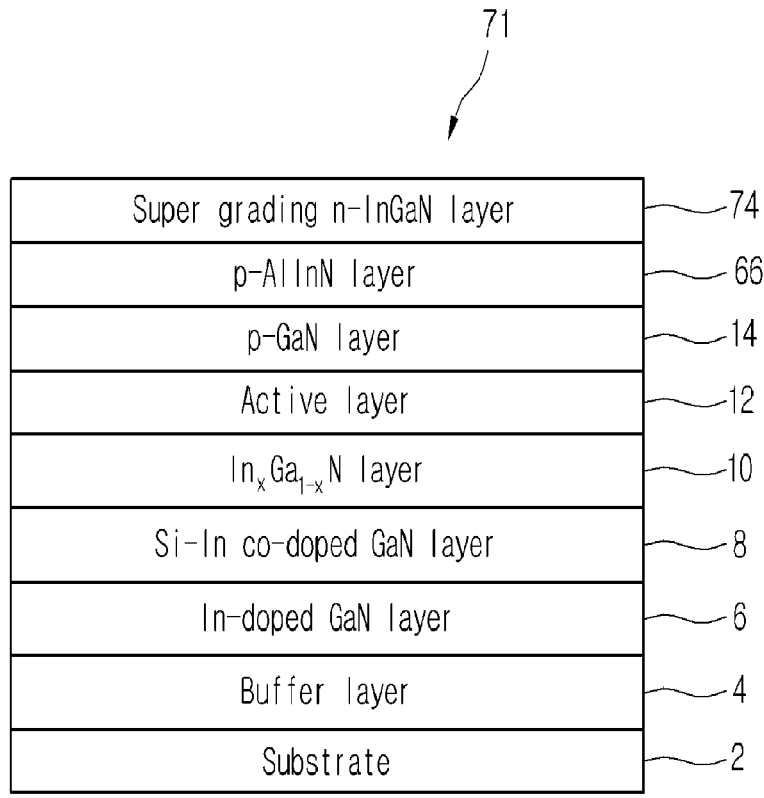
[Fig. 6]
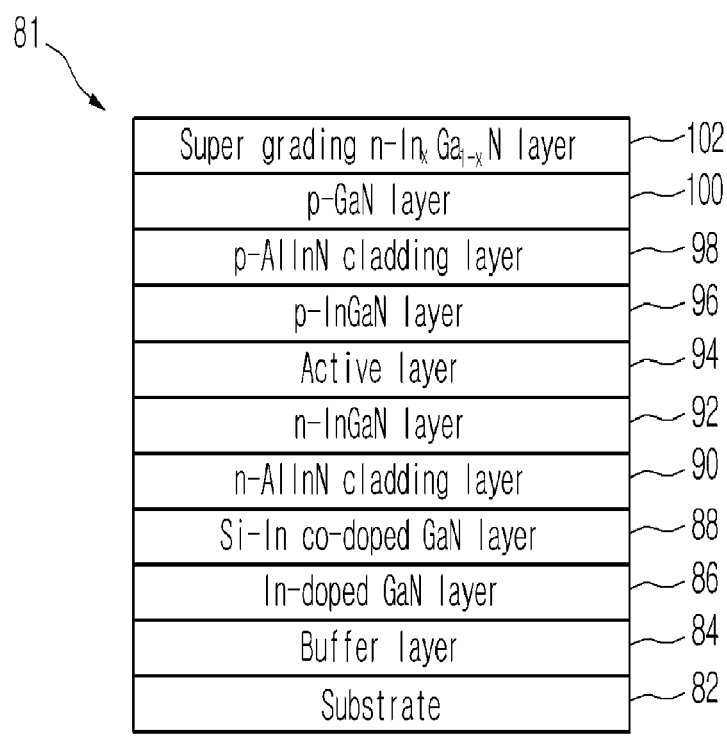
[Fig. 7]

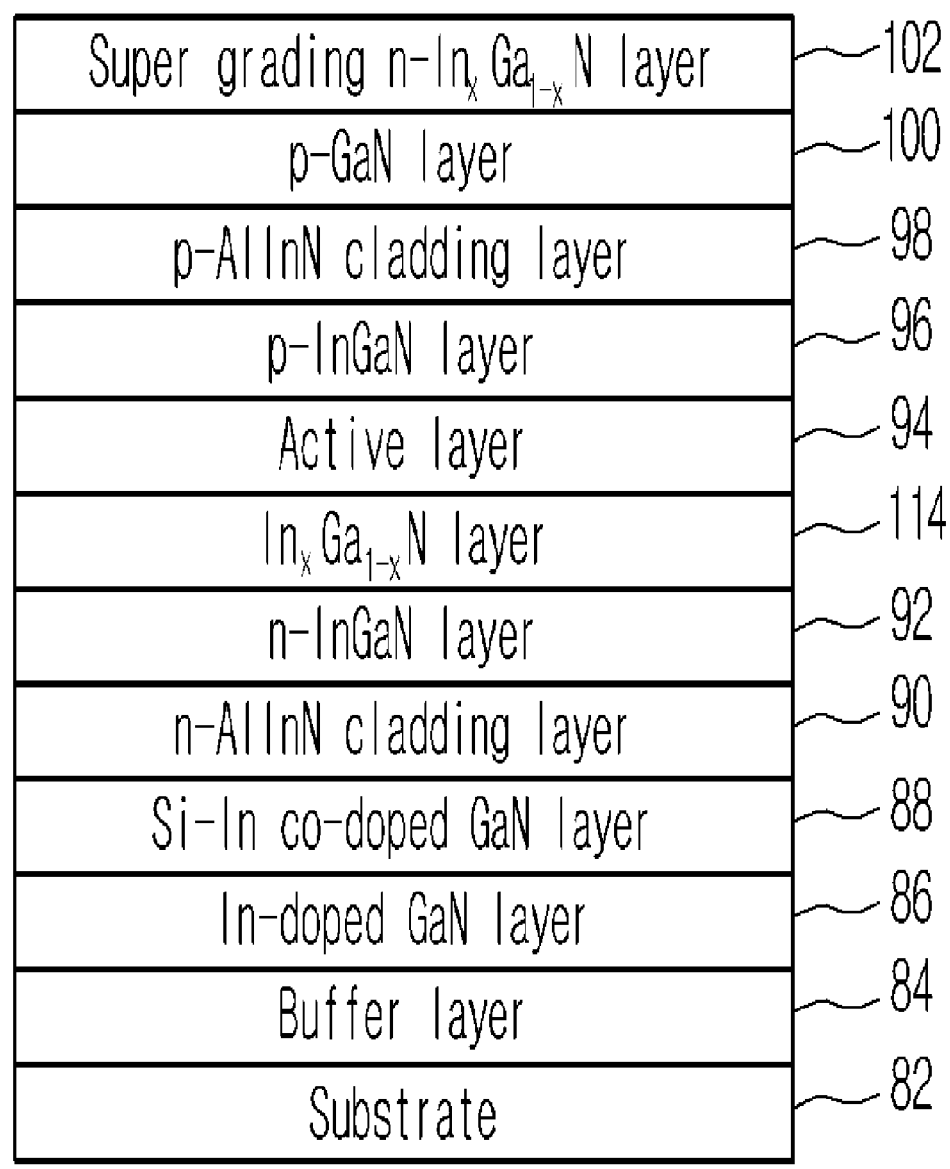
[Fig. 8]

[Fig. 9]
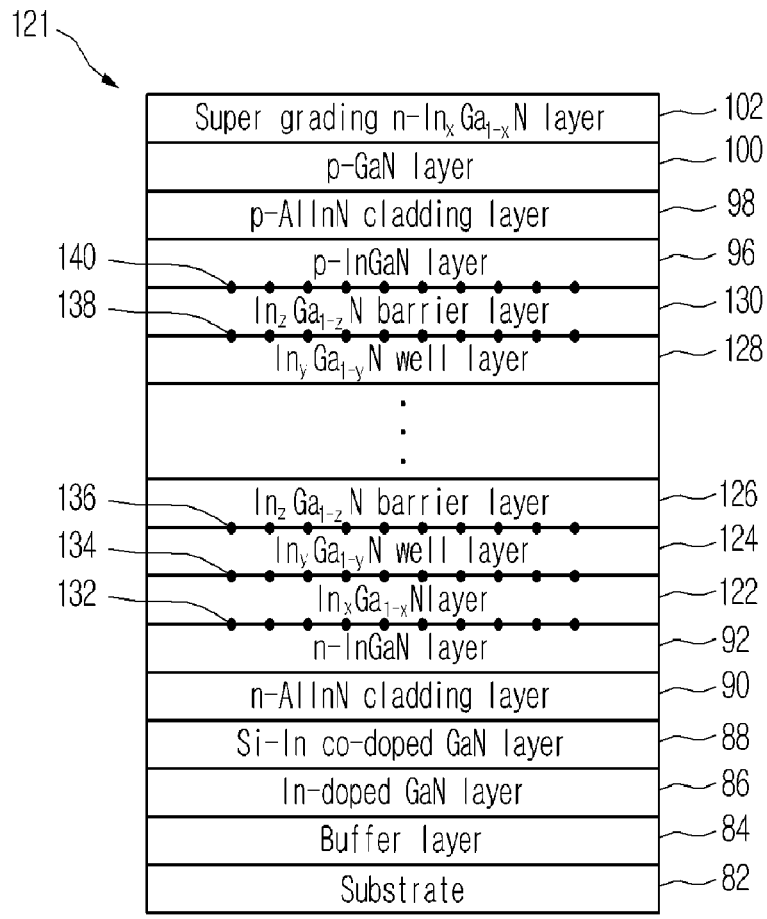
[Fig. 10]
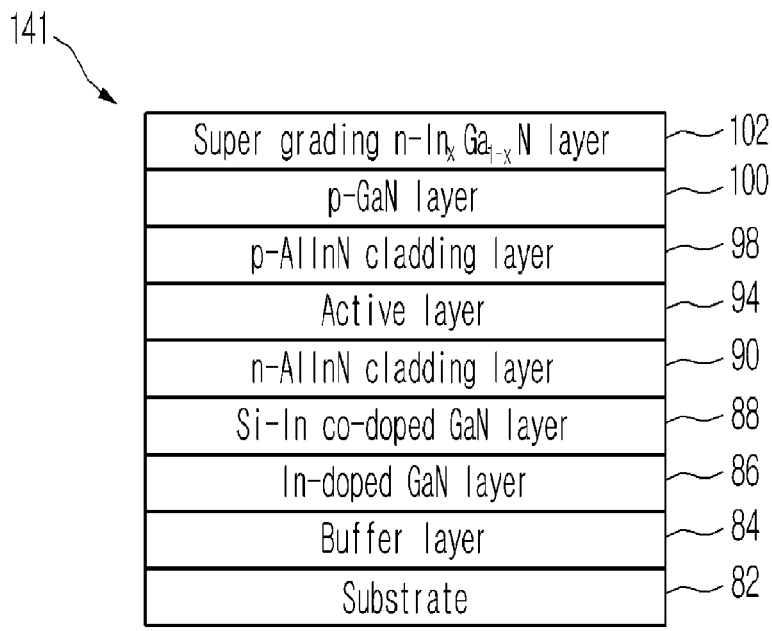

[Fig. 11]
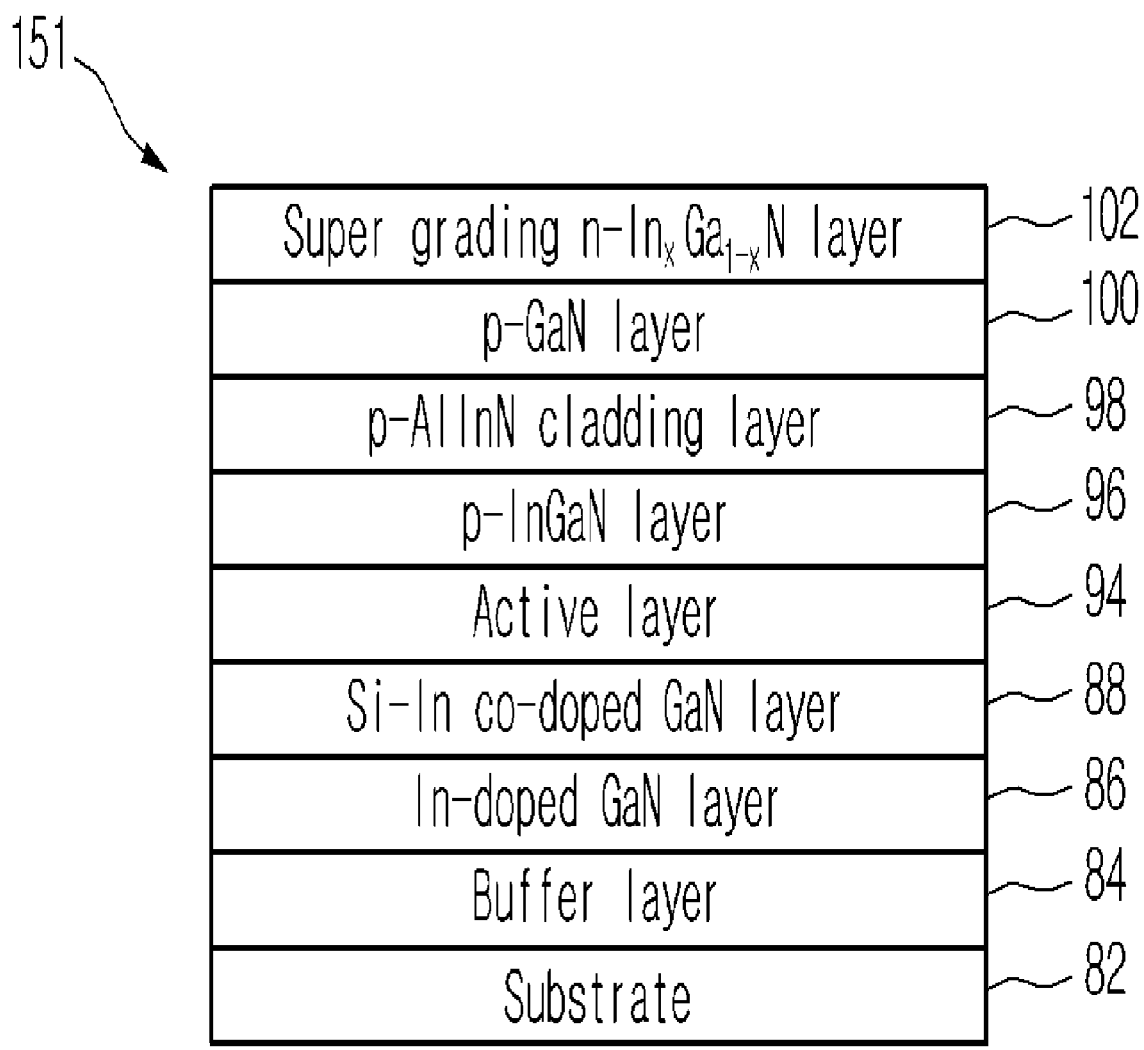

NITRIDE SEMICONDUCTOR LIGHT EMITTING DEVICE AND FABRICATION METHOD THEREOF

TECHNICAL FIELD

The present invention relates to a nitride semiconductor light-emitting device and fabrication method thereof.

BACKGROUND ART

Generally, GaN-based nitride semiconductors find its application fields in electronic devices (i.e., high-speed switching and high output devices) such as optical devices of blue/green LED (Light Emitting Diode), MESFET (Metal Semiconductor Field Effect Transistor) and HEMT (High Electron Mobility Transistors).

The GaN based nitride semiconductor light emitting device is grown on a sapphire substrate or a SiC substrate. Then, an $Al_yGa_{1-y}N$ polycrystalline thin film is grown on the sapphire substrate or the SiC substrate as a buffer layer at a low growth temperature. Then, an undoped GaN layer, a Si-doped n-GaN layer, or a mixture of the above two structures is grown on the buffer layer at a high temperature to form an n-GaN layer. Also, a Mg-doped p-GaN layer is formed at upper layer to manufacture a nitride semiconductor light emitting device. An emission layer (a multiple quantum well structure activation layer) is interposed between the n-GaN layer and the p-GaN layer.

A related art p-GaN layer is formed by doping Mg atoms while growing crystal. It is required that Mg atoms implanted as a doping source during crystalline growth be substituted by Ga location and thus serve as a p-GaN layer. The Mg atoms are combined with a hydrogen gas dissolved in a carrier gas and a source to form a Mg—H complex in a GaN crystalline layer, resulting in a high resistant material of about 10□.

Accordingly, after a pn junction light-emitting device is formed, there is an need for a subsequent activation process for cutting the Mg—H complex and substituting the Mg atoms at the Ga location. However, in the light-emitting device, the amount of carriers contributing to light emission in the activation process is about $10^{17}/□$, which is very lower than the Mg atomic concentration of $10^{19}/□$ or higher. Accordingly, there is a disadvantage in that it is very difficult to form a resistive contact.

Furthermore, the Mg atoms remaining within the p-GaN nitride semiconductor without being activated as carriers serve as the center at which light emitted from the interface with the active layer is trapped, abruptly decreasing the optical output. In order to improve this problem, a method in which contact resistance is lowered to increase current injection efficiency using a very thin transparent resistive metal material has been employed.

However, the thin transparent resistive metal used to decrease the contact resistance is about 75 to 80% in optical transmittance. The remaining optical transmittance serves as loss. More particularly, there is a limit to reducing an operating voltage due to high contact resistance.

DISCLOSURE OF INVENTION

Technical Problem

An object of the present invention is to provide a nitride semiconductor light-emitting device and fabrication method thereof, wherein the crystallinity of an active layer constituting the nitride semiconductor light-emitting device can be improved and the optical output and reliability can be improved.

Technical Solution

In order to accomplish the above object, a first embodiment of a nitride semiconductor light-emitting device according to the present invention comprises a first nitride semiconductor layer; an active layer formed on the first nitride semiconductor layer; a second nitride semiconductor layer formed on the active layer; and a third nitride semiconductor layer having AlIn, which is formed on the second nitride semiconductor layer.

Furthermore, in order to accomplish the above object, a second embodiment of a nitride semiconductor light-emitting device according to the present invention comprises a substrate; a buffer layer forming on the substrate; a first GaN based layer into which In is doped, the first GaN based layer being formed on the buffer layer; a second GaN based layer into which Si and In are doped, the second GaN based layer being formed on the first GaN based layer; an $In_xGa_{1-x}N$ layer formed on the second GaN based layer; an active layer formed on the $In_xGa_{1-x}N$ layer; a p-GaN based layer formed on the active layer; and an n-AlInN layer or a p-AlInN layer formed on the p-GaN based layer.

Furthermore, in order to accomplish the above object, a third embodiment of a nitride semiconductor light-emitting device according to the present invention comprises a first nitride semiconductor layer; an n-AlInN cladding layer formed on the first nitride semiconductor layer; an n-InGaN layer formed on the n-AlInN cladding layer; an active layer formed on the n-InGaN layer; a p-InGaN layer formed on the active layer; a p-AlInN cladding layer formed on the p-InGaN layer; and a second nitride semiconductor layer formed on the p-AlInN cladding layer.

Furthermore, in order to accomplish the above object, a fourth embodiment of a nitride semiconductor light-emitting device according to the present invention comprises a first nitride semiconductor layer; an n-AlInN cladding layer formed on the first nitride semiconductor layer; an active layer formed on the n-AlInN cladding layer; a p-AlInN cladding layer formed on the active layer; and a second nitride semiconductor layer formed on the p-AlInN cladding layer.

Furthermore, in order to accomplish the above object, a fifth embodiment of a nitride semiconductor light-emitting device according to the present invention comprises a first nitride semiconductor layer; an active layer formed on the first nitride semiconductor layer; a p-InGaN layer formed on the active layer; a p-AlInN cladding layer formed on the p-InGaN layer; and a second nitride semiconductor layer formed on the p-AlInN cladding layer.

Furthermore, in order to accomplish the above object, a first embodiment of a method of fabricating a nitride semiconductor light-emitting device according to the present invention comprises: forming a buffer layer on a substrate; forming a GaN based layer on the buffer layer; forming a first electrode layer on the GaN based layer; forming an $In_xGa_{1-x}N$ layer on the first electrode layer; forming an active layer on the $In_xGa_{1-x}N$ layer; forming a p-GaN based layer on the active layer; and forming an n-AlInN layer or a p-AlInN layer on the p-GaN based layer.

Furthermore, in order to accomplish the above object, a second embodiment of a method of fabricating a nitride semiconductor light-emitting device according to the present invention comprises: forming a buffer layer on a substrate; forming an In-doped GaN based layer into which indium (In)

is doped on the buffer layer; forming a first electrode layer on the In-doped GaN based layer; forming an n-AlInN cladding layer on the first electrode layer; forming an active layer on the n-AlInN cladding layer; forming a p-AlInN cladding layer on the active layer; forming a p-GaN based layer on the p-AlInN cladding layer; and forming a second electrode layer on the p-GaN based layer.

Furthermore, in order to accomplish the above object, a third embodiment of a method of fabricating a nitride semiconductor light-emitting device according to the present invention comprises: forming a buffer layer on a substrate; forming an In-doped GaN based layer into which indium (In) is doped on the buffer layer; forming a first electrode layer on the In-doped GaN based layer; forming an active layer that emits light on the first electrode layer; forming a p-InGaN layer on the active layer; forming a p-AlInN cladding layer on the p-InGaN layer; forming a p-GaN based layer on the p-AlInN cladding layer; and forming a second electrode layer on the p-GaN based layer.

Advantageous Effects

According to the present invention, the crystallinity of an active layer constituting a nitride semiconductor light-emitting device can be improved and the optical output and reliability can be improved.

BRIEF DESCRIPTION OF THE DRAWINGS

FIG. 3 is a view schematically showing the stack structure of a nitride semiconductor light-emitting device according to a third embodiment of the present invention.

FIG. 4 is a view schematically showing the stack structure of a nitride semiconductor light-emitting device according to a fourth embodiment of the present invention.

FIG. 5 is a view schematically showing the stack structure of a nitride semiconductor light-emitting device according to a fifth embodiment of the present invention.

FIG. 6 is a view schematically showing the stack structure of a nitride semiconductor light-emitting device according to a sixth embodiment of the present invention.

FIG. 7 is a view schematically showing the stack structure of a nitride semiconductor light-emitting device according to a seventh embodiment of the present invention.

FIG. 8 is a view schematically showing the stack structure of a nitride semiconductor light-emitting device according to an eighth embodiment of the present invention.

FIG. 9 is a view schematically showing the stack structure of a nitride semiconductor light-emitting device according to a ninth embodiment of the present invention.

FIG. 10 is a view schematically showing the stack structure of a nitride semiconductor light-emitting device according to a tenth embodiment of the present invention.

FIG. 11 is a view schematically showing the stack structure of a nitride semiconductor light-emitting device according to an eleventh embodiment of the present invention.

MODE FOR THE INVENTION

The present invention will be described in detail below in connection with embodiments with reference to the accompanying drawings.

Figure 1:
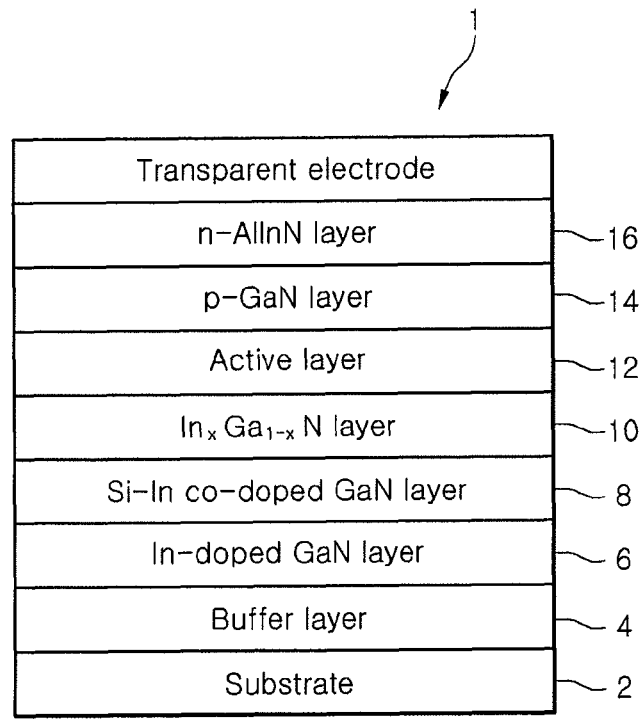
FIG. 1 is a view schematically showing the stack structure of a nitride semiconductor light-emitting device according to a first embodiment of the present invention.

FIG. 1 is a view schematically showing the stack structure of a nitride semiconductor light-emitting device according to a first embodiment of the present invention.

A nitride semiconductor light-emitting device 1 according to the present invention includes a buffer layer 4 formed on a substrate 2, as shown in FIG. 1. In this case, the buffer layer 4 can have one of an AlInN/GaN stack structure, an InGaN/GaN supperlattice structure, an $In_xGa_{1-x}N/GaN$ stack structure, an $Al_xIn_yGa_{1-(x+y)}N/In_xGa_{1-x}N/GaN$ stack structure ($0 \leq x \leq 1$, $0 \leq y \leq 1$, $x+y \leq 1$).

An In-doped GaN layer 6 into which indium is doped is then formed on the buffer layer 4. A n-type first electrode layer is formed on the In-doped GaN layer 6. In this case, a Si—In co-doped GaN layer 8 into which silicon and indium are doped at the same time can be adopted as the n-type first electrode layer.

An InxGa1-xN layer 10 having a low content of indium is also formed on the Si—In co-doped GaN layer 8. An active layer 12 for emitting light is formed on the InxGa1-xN layer 10. The active layer 12 can have a single quantum well structure or a multi quantum well structure formed as an InGaN well layer/InGaN barrier layer. An example of the stack structure will be described in more detail with reference to FIG. 3 later on.

A p-GaN layer 14 is then formed on the active layer 12. At this time, the p-GaN layer 14 may be formed so that it may be doped with magnesium.

A n-type second electrode layer is then formed on the p-GaN layer 14. In this case, an n-AlInN layer 16 may be adopted as the n-type second electrode layer. At this time, the n-AlInN layer 16 may be formed so that it may be doped with silicon.

In the nitride semiconductor light-emitting device according to the present invention, the Si—In co-doped GaN layer 8 (i.e., the first electrode layer) and the n-AlInN layer 16 (i.e., the second electrode layer) are all formed using n-type nitride and the p-GaN layer 14 is formed between the Si—In co-doped GaN layer 8 and the n-AlInN layer 16. In view of the above, it can be considered that the nitride semiconductor light-emitting device according to the present invention has an n/p/n junction light-emitting device structure unlike the related art p/n junction light-emitting device.

As described above, the present invention can provide a scheme in which a low carrier concentration generating due to the structure of the related art p/n junction light-emitting device and low Mg doping efficiency of the p-GaN nitride semiconductor itself, and a current crowding problem depending on an increase of contact resistance accordingly can be overcome.

More particularly, by forming the n-AlInN nitride semiconductor on an upper side, transparent conductive oxide such as ITO having optical transmittance of 95% higher can be used as a transparent electrode. That is, the transparent electrode for applying a bias voltage to an n-AlInN layer may include a transparent resistive material or transparent conductive oxide, which can maximize current spreading so as to maximize the optical output and has a good optical transmittance. ITO, ZnO, RuOx, IrOx, NiO, or Au alloy metal including Ni may be used as such a material. It is thus possible to implement the optical output of 50% or higher compared to the related art p/n junction through the use of the transparent electrode.

Furthermore, the present invention can lower an operating voltage owing to low contact resistance and can improve the reliability of devices accordingly. More particularly, a high output light-emitting device using a flip chip method necessarily requires a low operating voltage when being applied with the current of a large area 300 mA or higher. If contact resistance of the light-emitting device itself is relatively high so as to apply the same current, the operating voltage is increased. Accordingly, heat of 100° C. or higher is generated in the light-emitting device itself. Heat generated internally has a decisive influence on the reliability.

According to the n/p/n junction light-emitting device in accordance with the present invention, when the same current is applied due to low contact resistance, the device can be driven a relatively low operating voltage and heat generating within the device is low. Therefore, a light-emitting device with high reliability can be provided.

Figure 2:
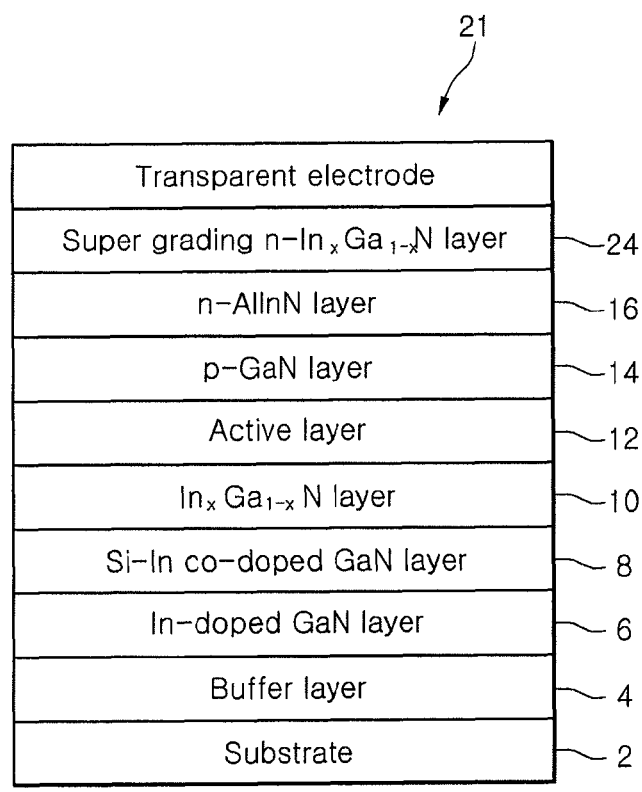
FIG. 2 is a view schematically showing the stack structure of a nitride semiconductor light-emitting device according to a second embodiment of the present invention.

Meanwhile, FIG. 2 is a view schematically showing the stack structure of a nitride semiconductor light-emitting device according to a second embodiment of the present invention.

The stack structure of the nitride semiconductor light-emitting device 21 according to a second embodiment of the present invention shows a case where a super grading n-In$_x$Ga1-xN layer 24 whose energy bandgap is controlled by sequentially changing the indium composition is further formed on the n-AlInN layer 16, when compared with the nitride semiconductor light-emitting device 1 shown in FIG. 1. At this time, the super grading n-InxGa1-xN layer 24 can be formed to have the composition of 0<x<0.2. At this time, the super grading n-InxGa1-xN layer 24 may be doped with silicon.

A nitride semiconductor light-emitting device 21 having this stack structure can be considered as an n/n/p/n junction light-emitting device. Further, in the nitride semiconductor light-emitting device 21 having this stack structure, a transparent electrode for applying a bias voltage can be formed on the super grading n-In$_x$Ga$_{1-x}$N layer 24.

Furthermore, though not shown in the drawing, an InGaN/AlInGaN supperlattice structure layer or an InGaN/InGaN supperlattice structure layer can be formed on the n-AlInN layer 16 instead of the super grading n-In$_x$Ga$_{1-x}$N layer 24. In this case, the InGaN/AlInGaN supperlattice structure layer or the InGaN/InGaN supperlattice structure layer may be doped with silicon.

The structure of an active layer adopted in a nitride semiconductor light-emitting device 31 according to the present invention will be described in more detail with reference to FIG. 3. FIG. 3 is a view schematically showing the stack structure of a nitride semiconductor light-emitting device according to a third embodiment of the present invention. The layers (the same reference numerals given), which have been described with reference to FIG. 1, of the stack structure shown in FIG. 3, will not be described.

In the nitride semiconductor light-emitting device 31 according to a third embodiment of the present invention, a low-mole InxGa1-xN layer 10 having a low content of indium that controls the strain of the active layer is formed in order to increase internal quantum efficiency, as shown in FIG. 3. Furthermore, in order to improve the optical output and reverse leakage current due to indium fluctuation, SiNx cluster layers 33, 35, which are controlled in atomic scale form, are further formed on top and bottom surfaces of the low-mole InxGa1-xN layer 10, respectively.

Furthermore, the active layer that emits light can have a single quantum well structure or a multiple quantum well structure formed of an InYGa1-yN well layer/InzGa1-zN barrier layer.

FIG. 3 shows an example of the light-emitting device having a multiple quantum well structure in which SiNx cluster layers 39, 45 are further provided between InYGa 1-yN well layers 37, 43 and InzGa1-zN barrier layers 41, 47 as the active layers. In this case, in order to improve light-emitting efficiency of the active layer, the composition ratio can be controlled to InYGa1-yN well layer (0<y<0.35)/SiNx cluster layer/InzGa1-zN barrier layer (0<z<0.1). Further, when considering the relation with the low-mole InxGa1-xN layer 10 having a low content of indium, the content of indium doped into the InYGa1-yN well layers 37, 43, the content of indium doped into the InzGa1-zN barrier layers 41, 47, and the content of indium doped into the low-mole InxGa1-xN layer 10 can be controlled to have the values of 0<x<0.1, 0<y<0.35 and 0<z<0.1, respectively.

Furthermore, though not shown in the drawing, a GaN cap layer that controls the amount of indium fluctuation in the InYGa1-yN well layer can be further formed between the InYGa1-yN well layer and the InzGa1-zN barrier layer, which form the active layers. At this time, the contents of indium of the well layer and the barrier layer that emit light can be constructed using InYGa1-yN(0<y<0.35)/GaN cap/InzGa1-zN(0<z<0.1).

Furthermore, after the last layer of the active layer, which has a single quantum well structure or a multiple quantum well structure, is grown, a SiNx cluster layer 140 is grown to a thickness of atomic scale, so that internal diffusion of the active layer within Mg atoms of the p-GaN layer 100 can be prohibited.

Meanwhile, FIG. 4 is a view schematically showing the stack structure of a nitride semiconductor light-emitting device according to a fourth embodiment of the present invention. The layers (the same reference numerals given), which have been described with reference to FIG. 1, of the stack structure shown in FIG. 4, will not be described.

A nitride semiconductor light-emitting device 51 according to a fourth embodiment of the present invention further includes a super grading n-InxGa1-xN layer 52 whose energy bandgap is controlled by sequentially changing the indium composition is further formed on the p-GaN layer 14. Furthermore, FIG. 4 shows a case where an n-AlInN layer 54 is further formed on the super grading n-InxGa1-xN layer 52.

The nitride semiconductor light-emitting device 51 having this stack structure can be interpreted as an n/n/p/n junction light-emitting device. Further, in the nitride semiconductor light-emitting device 51 having this stack structure, a transparent electrode for applying a bias voltage may be formed in the n-AlInN layer 54.

Meanwhile, although FIG. 4 shows a case where the super grading n-In$_x$Ga$_{131-x}$N layer 52 is formed on the p-GaN layer 15, an InGaN/AlInGaN supperlattice structure layer or an InGaN/InGaN supperlattice structure may be formed on the p-GaN layer 15 instead of the super grading n-In$_x$Ga$_{1-x}$N layer 52.

Furthermore, FIG. 5 is a view schematically showing the stack structure of a nitride semiconductor light-emitting device according to a fifth embodiment of the present invention. The layers (the same reference numerals given), which have been described with reference to FIG. 1, of the stack structure shown in FIG. 5, will not be described.

A nitride semiconductor light-emitting device 61 according to a fifth embodiment of the present invention is characterized in that a p-AlInN layer 66 is formed on the p-GaN layer 16. In this case, the p-AlInN layer 66 may be doped with magnesium.

The nitride semiconductor light-emitting device 61 having this stack structure can be interpreted as a p/n junction light-emitting device, but can provide light-emitting efficiency similar to other embodiments by way of a physical characteristic of the p-AlInN layer 66. Further, in the nitride semiconductor light-emitting device 61 having this stack structure, a transparent electrode for applying a bias voltage may be formed in the p-AlInN layer 66.

Further, FIG. 6 is a view schematically showing the stack structure of a nitride semiconductor light-emitting device according to a sixth embodiment of the present invention.

The stack structure of a nitride semiconductor light-emitting device 71 according to a sixth embodiment of the present invention shows a case where a super grading n-InxGa1-xN layer 74 whose energy bandgap is controlled by sequentially changing the indium composition is further formed on the p-AlInN layer 66, when compared with the nitride semiconductor light-emitting device 61 shown in FIG. 5. At this time, the super grading n-InxGa1-xN layer 74 may be formed to have the composition of $0<x<0.2$. At this time, the super grading n-InxGa1-xN layer 74 may be doped with silicon.

A nitride semiconductor light-emitting device 71 having this stack structure can be considered as an n/p/p/n junction light-emitting device. Further, in the nitride semiconductor light-emitting device 71 having this stack structure, a transparent electrode for applying a bias voltage may be formed in the super grading n-InxGa1-xN layer 74.

Furthermore, though not shown in the drawing, an InGaN/AlInGaN supperlattice structure layer or an InGaN/InGaN supperlattice structure layer may be formed on the n-AlInN layer 66 instead of the super grading n-$In_xGa_{1-x}$N layer 74. In this case, the InGaN/AlInGaN supperlattice structure layer or the InGaN/InGaN supperlattice structure layer may be doped with silicon.

Meanwhile, FIG. 7 is a view schematically showing the stack structure of a nitride semiconductor light-emitting device according to a seventh embodiment of the present invention.

A nitride semiconductor light-emitting device 81 according to the present invention includes a buffer layer 84 formed on the substrate 82, as shown in FIG. 7. In this case, the buffer layer 84 may have an AlInN/GaN stack structure, an InGaN/GaN supperlattice structure, an $In_xGa_{1-x}$N/GaN stack structure or the stack structure of $Al_xIn_yGa_{1-(x+y)}$N/$In_xGa_{1-x}$N/GaN.

Further, an In-doped GaN layer 86 into which indium is doped is formed on the buffer layer 84. A n-type first electrode layer is formed on the In-doped GaN layer 86. In this case, a Si—In co-doped GaN layer 88 into which silicon and indium are doped at the same time can be adopted as the n-type first electrode layer.

Furthermore, an n-AlInN cladding layer 90 is formed on the Si—In co-doped GaN layer 88. An n-InGaN layer 92 is formed on the n-AlInN cladding layer 90. An active layer 94 that emits light is also formed on the n-InGaN layer 92. The active layer 94 may have a single quantum well structure or a multiple quantum well structure. An example of the stack structure constituting the active layer 94 will be described in more detail later on with reference to FIG. 9. In addition, according to the active layer 94 in accordance with the present invention, there is an advantage in that sufficient optical efficiency can be accomplished even the active layer 94 has a single quantum well structure.

Thereafter, a p-InGaN layer 96 is formed on the active layer 94. A p-AlInN cladding layer 98 is formed on the p-InGaN layer 96. Furthermore, a p-GaN layer 100 is formed on the p-AlInN cladding layer 98. At this time, the p-GaN layer 100 may be doped with magnesium (Mg).

In addition, an n-type second electrode layer is formed on the p-GaN layer 100. In this case, a super grading n-InxGa1-xN layer 102 whose energy bandgap is controlled by sequentially changing the indium composition can be adopted as the n-type second electrode layer. At this time, the composition of the super grading n-InxGa1-xN layer 102 can be controlled to $0<x<0.2$. Further, the super grading n-InxGa1-xN layer 102 may doped with silicon.

As described above, in the nitride semiconductor light-emitting device according to the present invention, both the first electrode layer 88 and the second electrode layer 102 are formed using an n-type nitride semiconductor and the p-GaN layer 100 is formed therebetween. Therefore, in view of the above structure, it can be considered that the nitride semiconductor light-emitting device of the present invention has an npn junction light-emitting device structure unlike the related art pn junction light-emitting device.

Furthermore, the n-type nitride semiconductor (e.g., the super grading n-InxGa1-xN layer 102), which is used as the second electrode layer, has resistance lower than that of an existing p-GaN contact layer. Thus, contact resistance can be reduced and current implantation can be maximized. In addition, a transparent electrode for applying a bias voltage to the second electrode layer can include a transparent resistive material or transparent conductive oxide, which can maximize current dispersing so as to maximize the optical output and have a good optical transmittance. ITO, ZnO, RuOx, IrOx, NiO, or Au alloy metal including Ni may be used as such a material.

In this case, though not shown in the drawing, the second electrode layer may have an InGaN/AlInGaN supperlattice structure layer or an InGaN/InGaN supperlattice structure layer. Further, the InGaN/AlInGaN supperlattice structure layer or the InGaN/InGaN supperlattice structure layer may be doped with silicon.

Furthermore, though not shown in the drawing, an n-AlInN layer may be used as the second electrode layer.

According to the nitride semiconductor light-emitting device 81 constructed above in accordance with the present invention, the n-AlInN cladding layer 90 and the p-AlInN cladding layer 98 are inserted lower/upper side to the active layers 94, respectively. Therefore, internal quantum efficiency can be improved by prohibiting carrier implantation efficiency within the active layer 94 and current overflow.

Further, FIG. 8 is a view schematically showing the stack structure of a nitride semiconductor light-emitting device according to an eighth embodiment of the present invention. The layers (the same reference numerals given), which have been described with reference to FIG. 7, of the stack structure shown in FIG. 8, will not be described.

The nitride semiconductor light-emitting device 111 according to an eighth embodiment of the present invention is different from the nitride semiconductor light-emitting device 81 shown in FIG. 7 according to the seventh embodiment in that an InxGa1-xN layer 114 having a low content of indium.

That is, according to the nitride semiconductor light-emitting device 111 in accordance with an eighth embodiment of the present invention, the InxGa1-xN layer 114 having a low content of indium is further formed between the n-InGaN layer 92 and the active layer 94. The reason is that in order to increase internal quantum efficiency, the InxGa1-xN layer 114 having a low content of indium is further formed so that it can control the strain of the active layer 94.

The structure of an active layer adopted in a nitride semiconductor light-emitting device 121 according to the present invention will be described in more detail with reference to FIG. 9. FIG. 9 is a view schematically showing the stack structure of a nitride semiconductor light-emitting device according to an ninth embodiment of the present invention.

The layers (the same reference numerals given), which have been described with reference to FIG. 7, of the stack structure shown in FIG. 9, will not be described.

The nitride semiconductor light-emitting device 121 according to a ninth embodiment of the present invention includes a low-mole InxGa1-xN layer 122 having a low content of indium, which controls the strain of the active layer, in order to increase internal quantum efficiency, as shown in FIG. 9. Furthermore, in order to improve the optical output and reverse leakage current due to indium fluctuation, SiNx cluster layers 132, 134, which are controlled in atomic scale form, are further formed on top and bottom surfaces of the low-mole InxGa1-xN layer 122.

Furthermore, the active layer that emits light may have a single quantum well structure or a multiple quantum well structure formed using an InYGa1-YN well layer/InzGa1-zN barrier layer.

FIG. 9 shows an example of the light-emitting device having a multiple quantum well structure in which SiNx cluster layers 136, 138 are further provided between InYGa1-YN well layers 124, 128 and InzGa1-zN barrier layers 126, 130 as the active layers. In this case, in order to improve emission efficiency of the active layer, the composition ratio may be controlled to InYGa1-YN well layer (0<y<0.35)/SiNx cluster layer/InzGa1-zN barrier layer (0<z<0.1). Further, when considering the relation with the low-mole InxGa1-xN layer 122 having a low content of indium, the content of indium doped into the InYGa1-YN well layers 124, 128, the content of indium doped into the InzGa1-zN barrier layers 126, 130 and the content of indium doped into the low-mole InxGa1-xN layer 122 may be controlled to have 0<x<0.1, 0<y<0.35 and 0<z<0.1, respectively.

Furthermore, though not shown in the drawing, a GaN cap layer that controls the amount of indium fluctuation in the InYGa1-YN well layer may be further formed between the InYGa1-YN well layer and the InzGa1-zN barrier layer, which form the active layers. At this time, the content of indium of each of the well layer and the barrier layer that emit light may be constructed using InYGa1-YN (0<y<0.35)/GaN cap/InzGa1-zN (0<z<0.1).

Furthermore, after the last layer of the active layer, which has a single quantum well structure or a multiple quantum well structure, is grown, a SiNx cluster layer 140 is grown to a thickness of atomic scale, so that internal diffusion of the active layer within Mg atoms of the p-GaN layer 100 can be prohibited.

Meanwhile, FIG. 10 is a view schematically showing the stack structure of a nitride semiconductor light-emitting device according to a tenth embodiment of the present invention. The layers (the same reference numerals given), which have been described with reference to FIG. 7, of the stack structure shown in FIG. 10, will not be described.

A nitride semiconductor light-emitting device 141 according to a tenth embodiment of the present invention includes an active layer 94 formed on an n-AlInN cladding layer 90 and a p-AlInN cladding layer 98 formed on the active layer 94.

That is, the nitride semiconductor light-emitting device 141 according to a tenth embodiment of the present invention has a modified stack structure in which the n-InGaN layer 92 and the p-InGaN layer 96 are not formed when compared with the nitride semiconductor light-emitting device 81 according to a seventh embodiment shown in FIG. 7.

Further, FIG. 11 is a view schematically showing the stack structure of a nitride semiconductor light-emitting device according to an eleventh embodiment of the present invention. The layers (the same reference numerals given), which have been described with reference to FIG. 7, of the stack structure shown in FIG. 11, will not be described.

A nitride semiconductor light-emitting device 151 according to an eleventh embodiment of the present invention includes an active layer 94 formed on a Si—In co-doped GaN layer 88 (i.e., a first electrode layer), and a p-InGaN layer 96 and a p-AlInN cladding layer 98 both of which are formed on the active layer 94.

That is, the nitride semiconductor light-emitting device 151 according to a eleventh embodiment of the present invention has a modified stack structure in which the n-AlInN cladding layer 90 and the n-InGaN layer 92 are not formed when compared with the nitride semiconductor light-emitting device 81 according to a seventh embodiment shown in FIG. 7.

INDUSTRIAL APPLICABLILITY

According to a nitride semiconductor light-emitting device and fabricating method thereof in accordance with the present invention, there are advantages in that the crystallinity of an active layer constituting a nitride semiconductor light-emitting device can be improved and the optical output and reliability can be improved.

The invention claimed is:

1. A nitride semiconductor light-emitting device, comprising:
   a substrate;
   a first nitride semiconductor layer on the substrate;
   an active layer formed on the first nitride semiconductor layer;
   a second nitride semiconductor layer formed on the active layer; and
   a single AlInN layer including silicon, which comes in contact with the second nitride semiconductor layer and transmits the light emitted from the active layer, wherein the first nitride semiconductor layer comprises:
   a GaN based layer into which In is doped or not doped;
   a first electrode layer comprising a single layer into which Si and In are co-doped, the first electrode layer formed on the GaN based layer; and
   an $In_xGa_{1-x}N$ layer formed on the first electrode layer,
   wherein the active layer includes a well layer and a barrier layer having InGaN,
   wherein the $In_xGa_{1-x}N$ layer is disposed between the first electrode layer and the well layer, and
   wherein an amount of indium in the $In_xGa_{1-x}N$ layer is lower than an amount of indium in the well layer.

2. The nitride semiconductor light-emitting device as claimed in claim 1, wherein a buffer layer on the substrate is further formed under the first nitride semiconductor layer.

3. The nitride semiconductor light-emitting device as claimed in claim 2, wherein the buffer layer has one of an AlInN/GaN stack structure, an InGaN/GaN superlattice structure, an $In_xGa_{1-x}N$/GaN stack structure and a stack structure of an $Al_xIn_yGa_{1-(x+y)}N/In_xGa_{1-x}N$/GaN.

4. The nitride semiconductor light-emitting device as claimed in claim 1, wherein the second nitride semiconductor layer is doped with magnesium.

5. The nitride semiconductor light-emitting device as claimed in claim 1, wherein the third nitride semiconductor layer is doped with silicon or magnesium.

6. The nitride semiconductor light-emitting device as claimed in claim 1, wherein a fourth nitride semiconductor layer of a super grading structure in which the content of indium is sequentially changed or a superlattice structure including In or Al is further formed on a top surface of the single AlInN layer.

7. The nitride semiconductor light-emitting device as claimed in claim 6, wherein the super grading structure has an $In_xGa_{1-x}N$ layer.

8. The nitride semiconductor light-emitting device as claimed in claim 7, wherein the super grading structure is an $In_xGa_{1-x}N$ layer (0<x<0.2).

9. The nitride semiconductor light-emitting device as claimed in claim 6, wherein the superlattice structure is an InGaN/AlInGaN superlattice structure layer or an InGaN/InGaN superlattice structure layer.

10. The nitride semiconductor light-emitting device as claimed in claim 6, wherein the fourth nitride semiconductor layer is doped with silicon.

11. The nitride semiconductor light-emitting device as claimed in claim 6, further comprising a transparent electrode formed on the fourth nitride semiconductor layer.

12. The nitride semiconductor light-emitting device as claimed in claim 1, further comprising a transparent electrode formed on the single AlInN layer.

13. The nitride semiconductor light-emitting device as claimed in claim 12, wherein the transparent electrode is formed using transparent conductive oxide or a transparent resistive material.

14. A nitride semiconductor light-emitting device, comprising:
a substrate;
a buffer layer forming on the substrate;
a first GaN based layer into which In is doped, the first GaN based layer being formed on the buffer layer;
a second GaN based layer comprising a single layer into which Si and In are co-doped, the second GaN based layer being formed on the first GaN based layer;
an $In_xGa_{1-x}N$ layer formed on the second GaN based layer;
an active layer formed on the $In_xGa_{1-x}N$ layer;
a p-GaN based layer formed on the active layer; and
a single n-AlInN layer including silicon which comes in contact with the p-GaN based layer and transmits the light emitted from the active layer,
wherein the active layer includes a well layer and a barrier layer having InGaN,
wherein the $In_xGa_{1-x}N$ layer is disposed between the second GaN based layer and the well layer, and
wherein an amount of indium in the $In_xGa_{1-x}N$ layer is lower than an amount of indium in the well layer.

15. The nitride semiconductor light-emitting device as claimed in claim 14, wherein a nitride semiconductor layer of a super grading structure whose content of indium is sequentially changed or a superlattice structure including In or Al is further formed on the n-AlInN layer or p-AlInN layer.

16. The nitride semiconductor light-emitting device as claimed in claim 15, further comprising a transparent electrode formed on the nitride semiconductor layer of the super grading structure or the superlattice structure.

17. The nitride semiconductor light-emitting device as claimed in claim 14, further comprising a transparent electrode formed on the n-AlInN layer or p-AlInN layer.

18. A nitride semiconductor light-emitting device, comprising:
a substrate;
a n-typed first nitride semiconductor layer on the substrate;
an active layer formed on the first nitride semiconductor layer;
a p-typed second nitride semiconductor layer formed on the active layer; and
a third nitride semiconductor layer having a single n-typed AlInN layer including silicon, which is formed on the p-typed semiconductor layer,
wherein the n-typed first nitride semiconductor layer comprises:
a GaN based layer into which In is doped or not doped;
a first electrode layer into which Si and In are doped at the same time, the first electrode layer formed on the GaN based layer; and
an $In_xGa_{1-x}N$ layer formed on the first electrode layer,
wherein the active layer includes a well layer and a barrier layer having InGaN,
wherein the $In_xGa_{1-x}N$ layer is disposed between the first electrode layer and the well layer, and
wherein an amount of indium in the $In_xGa_{1-x}N$ layer is lower than an amount of indium in the well layer.

* * * * *